US012687576B2

(12) United States Patent
Hsieh et al.

(10) Patent No.: US 12,687,576 B2
(45) Date of Patent: Jul. 21, 2026

(54) TESTING DEVICE AND TESTING SYSTEM

(71) Applicant: Materials Analysis Technology Inc., Zhubei City (TW)

(72) Inventors: Yu-Min Hsieh, Hualien County (TW); Hung-Jen Chen, Hsinchu City (TW)

(73) Assignee: MATERIALS ANALYSIS TECHNOLOGY INC., Zhubei City (TW)

( * ) Notice: Subject to any disclaimer, the term of this patent is extended or adjusted under 35 U.S.C. 154(b) by 184 days.

(21) Appl. No.: 18/882,841

(22) Filed: Sep. 12, 2024

(65) Prior Publication Data

US 2025/0362340 A1 Nov. 27, 2025

(30) Foreign Application Priority Data

May 23, 2024 (TW) .................................. 113119006

(51) Int. Cl.
*G01R 31/28* (2006.01)

(52) U.S. Cl.
CPC ..... *G01R 31/2884* (2013.01); *G01R 31/2874* (2013.01)

(58) Field of Classification Search
CPC .. G01R 1/0416; G01R 1/0433; G01R 1/0441; G01R 1/045; G01R 1/0458; G01R 1/0466; G01R 1/0475; G01R 1/0483; G01R 31/2884; G01R 31/2874; G01R 31/2886; G01R 31/2889; G01R 31/2863
See application file for complete search history.

(56) References Cited

U.S. PATENT DOCUMENTS

| | | | |
|---|---|---|---|
| 2006/0002161 A1* | 1/2006 | Dangelo ............ | G01R 31/2879 363/147 |
| 2008/0157808 A1 | 7/2008 | Khandros et al. | |
| 2012/0132140 A1* | 5/2012 | Chang ................... | A01K 67/30 119/6.5 |
| 2018/0100892 A1* | 4/2018 | Song ................. | G01R 31/2879 |

FOREIGN PATENT DOCUMENTS

| | | |
|---|---|---|
| CN | 1503132 A | 6/2004 |
| JP | 11251383 A | 9/1999 |
| JP | 2000195912 A | 7/2000 |
| JP | 2003501819 A | 1/2003 |

(Continued)

*Primary Examiner* — Lee E Rodak
*Assistant Examiner* — Demetrius R Pretlow
(74) *Attorney, Agent, or Firm* — Li & Cai Intellectual Property (USA) Office

(57) ABSTRACT

A testing device and a testing system are provided. The testing device includes a circuit mainboard. One side of the circuit mainboard includes a plurality of chip sockets, a plurality of power connectors, and a plurality of signal output connectors. A chip under test is detachably fixed on a chip carrier board. An external power supply can provide power to the chip under test on the chip carrier board through the power connectors and the circuit mainboard. Another side of the circuit mainboard a plurality of carrier board connectors. Each of signal carrier boards can be detachably disposed on the circuit mainboard through the carrier board connectors. Each of the signal carrier boards has a signal input connector and a connector at one end of a signal input line plugs into the signal input connectors.

10 Claims, 10 Drawing Sheets

(56)     References Cited

FOREIGN PATENT DOCUMENTS

| JP | 2003297887  A | 10/2003 |
| JP | 2009294194  A | 12/2009 |
| JP | 201293124  A | 5/2012 |
| JP | 2019537707  A | 12/2019 |
| KR | 19960009940  B1 | 7/1996 |
| TW | 200408931  A | 6/2004 |

* cited by examiner

TESTING DEVICE AND TESTING SYSTEM

CROSS-REFERENCE TO RELATED PATENT APPLICATION

This application claims the benefit of priority to Taiwan Patent Application No. 113119006, filed on May 23, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a testing device and a testing system, and more particularly to a testing device and a testing system that improve on the existing technology.

BACKGROUND OF THE DISCLOSURE

Existing technology lacks a device or a system that specifically provides mobile industry processor interface (MIPI) tests, and when technicians conduct MIPI tests, they usually use existing materials at hand, or based on the past experience of each of the laboratories to build a platform that can be used to conduct this test. Therefore, the technicians must re-build the corresponding platform each time the test is performed, which causes difficulties for the technicians performing the test. Furthermore, the test results of the platforms built by different technicians may have errors, thus causing a huge problem for the laboratories.

SUMMARY OF THE DISCLOSURE

In response to the above-referenced technical inadequacies, the present disclosure provides a testing device and a testing system to improve on the issue of the existing technology lacking a testing device or a testing system that specifically provides MIPI tests.

In order to solve the above-mentioned problems, one of the technical aspects adopted by the present disclosure is to provide a testing device. The testing device includes a circuit mainboard, a plurality of chip sockets, a plurality of signal output connectors, a plurality of carrier board connectors, a plurality of signal carrier boards, and a plurality of signal input connectors. Two opposite sides of the circuit mainboard are respectively defined as a first side and a second side, and a plurality of power connectors are disposed on the first side of the circuit mainboard. The plurality of chip sockets are disposed on the first side. Each of the chip sockets is used to carry a chip carrier board, and a chip under test is fixedly disposed on one side of the chip carrier board. The plurality of signal output connectors are disposed on the circuit mainboard. Each of the plurality of signal output connectors is used to connect with an external signal reading device. The plurality of carrier board connectors are disposed on the second side of the circuit mainboard. Each of the plurality of signal carrier board is detachably disposed on the second side of the circuit mainboard through the plurality of carrier board connectors, and each of the plurality of signal carrier boards is able to be electrically connected to the chip under test disposed on the chip socket on the first side through the carrier board connector and the circuit mainboard. Each of the plurality of signal carrier boards includes at least one of the plurality of signal input connectors, and a connector at one end of a signal input line plugs into the at least one of the plurality of signal input connectors. The chip under test obtains power provided by an external power supply from a corresponding one of the plurality of power connectors through a corresponding one of the plurality of chip carrier boards and the circuit mainboard. The chip under test obtains a test signal transmitted via the signal input line through the chip carrier board, the circuit mainboard, a corresponding one of the signal carrier boards, and a corresponding one of the signal input connectors. The chip under test transmits signals to the external signal reading device through the corresponding chip carrier board, the circuit mainboard, and a corresponding one of the signal output connectors.

In order to solve the above-mentioned problems, another one of the technical aspects adopted by the present disclosure is to provide a testing system. The testing system includes a testing device and a temperature control apparatus. The testing device includes a circuit mainboard, a plurality of chip sockets, a plurality of signal output connectors, a plurality of carrier board connectors, a plurality of signal carrier boards, and a plurality of signal input connectors. Two opposite sides of the circuit mainboard are respectively defined as a first side and a second side, and a plurality of power connectors are disposed on the first side of the circuit mainboard. The plurality of chip sockets are disposed on the first side. Each of the chip sockets is used to carry a chip carrier board, and a chip under test is fixedly disposed on one side of the chip carrier board. The plurality of signal output connectors are disposed on the circuit mainboard. Each of the plurality of signal output connectors is used to connect with an external signal reading device. The plurality of carrier board connectors are disposed on the second side of the circuit mainboard. Each of the plurality of signal carrier board is detachably disposed on the second side of the circuit mainboard through the plurality of carrier board connectors, and each of the plurality of signal carrier boards is able to be electrically connected to the chip under test disposed on the chip socket on the first side through the carrier board connector and the circuit mainboard. Each of the plurality of signal carrier boards includes at least one of the plurality of signal input connectors, and a connector at one end of a signal input line plugs into the at least one of the plurality of signal input connectors. The chip under test obtains power provided by an external power supply from a corresponding one of the plurality of power connectors through a corresponding one of the plurality of chip carrier boards and the circuit mainboard. The chip under test obtains a test signal transmitted via the signal input line through the chip carrier board, the circuit mainboard, a corresponding one of the signal carrier boards, and a corresponding one of the signal input connectors. The chip under test transmits signals to the external signal reading device through the corresponding chip carrier board, the circuit mainboard, and a corresponding one of the signal output connectors. The temperature control apparatus includes a movable door, at least one chamber, and at least one temperature control device. The movable door is able to be operated to close the at least one chamber, the temperature control device is used to maintain a temperature in the at least one chamber to be at a preset temperature. The at least one chamber is able to accommodate at least one of the testing device, such that the testing device performs testing at the preset temperature.

Therefore, in the testing device and the testing system provided by the present disclosure, by virtue of the chip carrier board being detachably disposed on the chip socket on one side of the circuit mainboard and the signal carrier board being detachably disposed on another side of the circuit mainboard, a testing personnel can easily modify or replace the chip carrier board or the signal carrier board according to a testing requirement of the chip under test, such that the chip under test can be tested under conditions in accordance with MIPI testing requirements.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
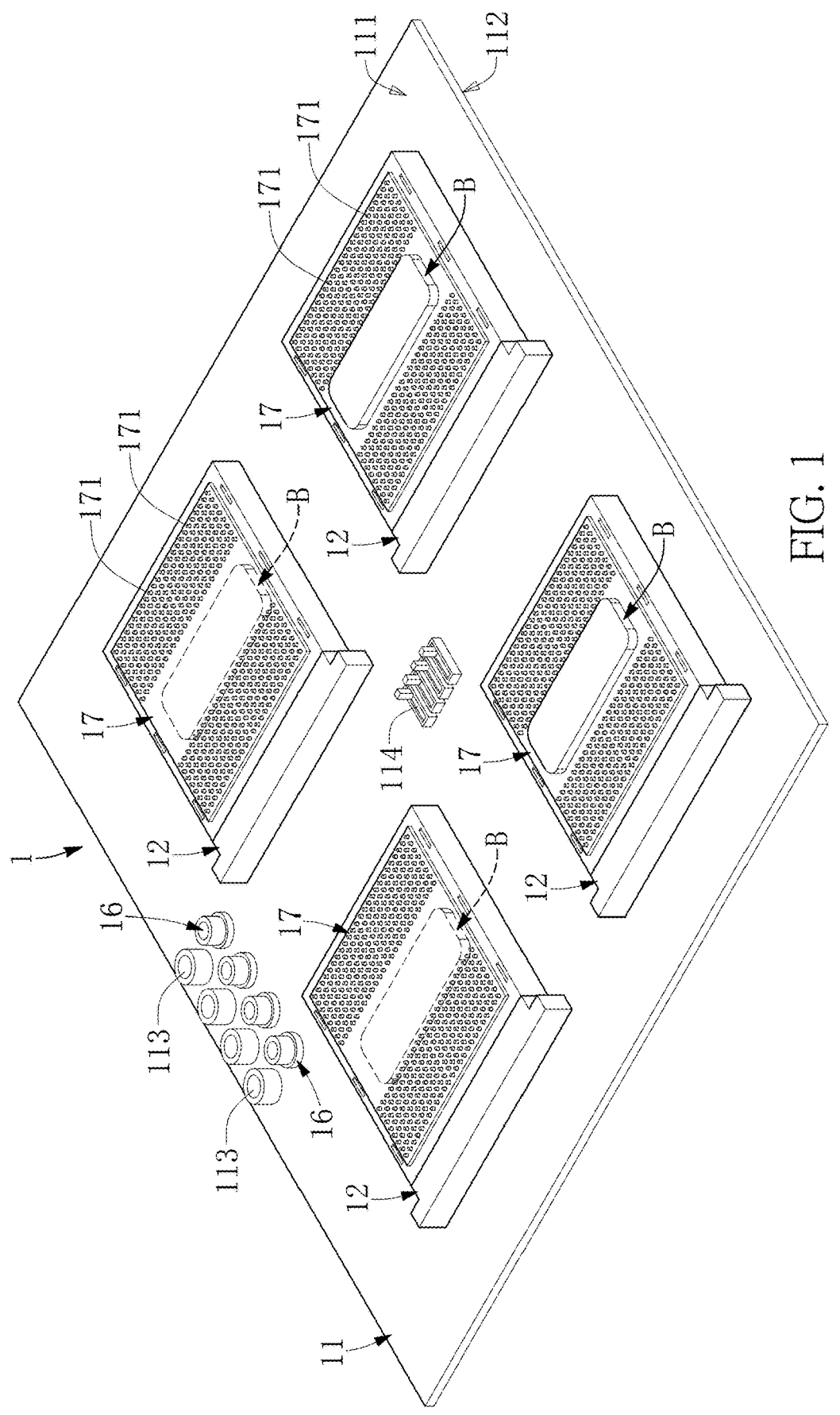
FIG. 1 and FIG. 2 are schematic views from different viewing angles of a testing device having a chip carrier board according to the present disclosure.
Figure 2:
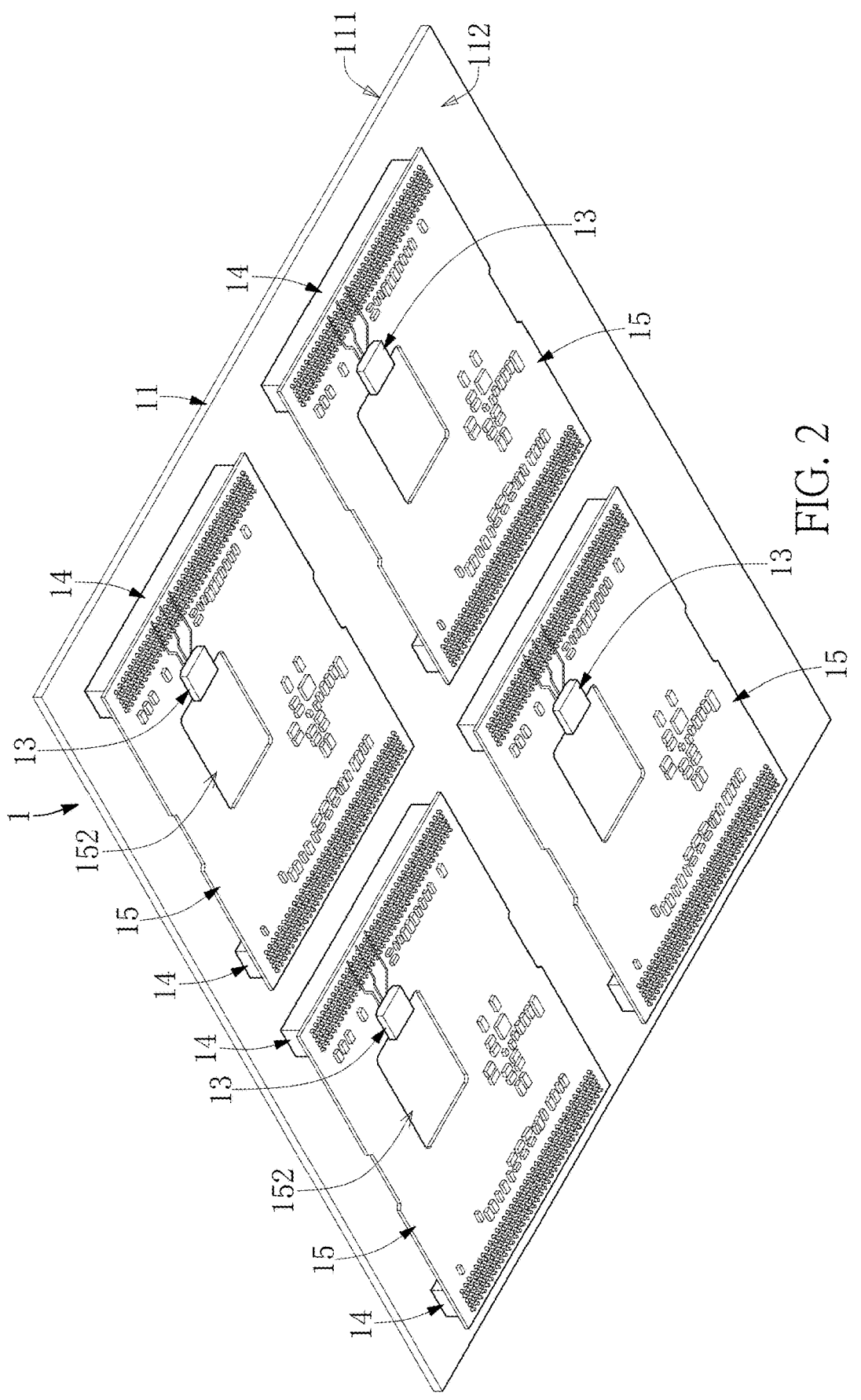

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 3:
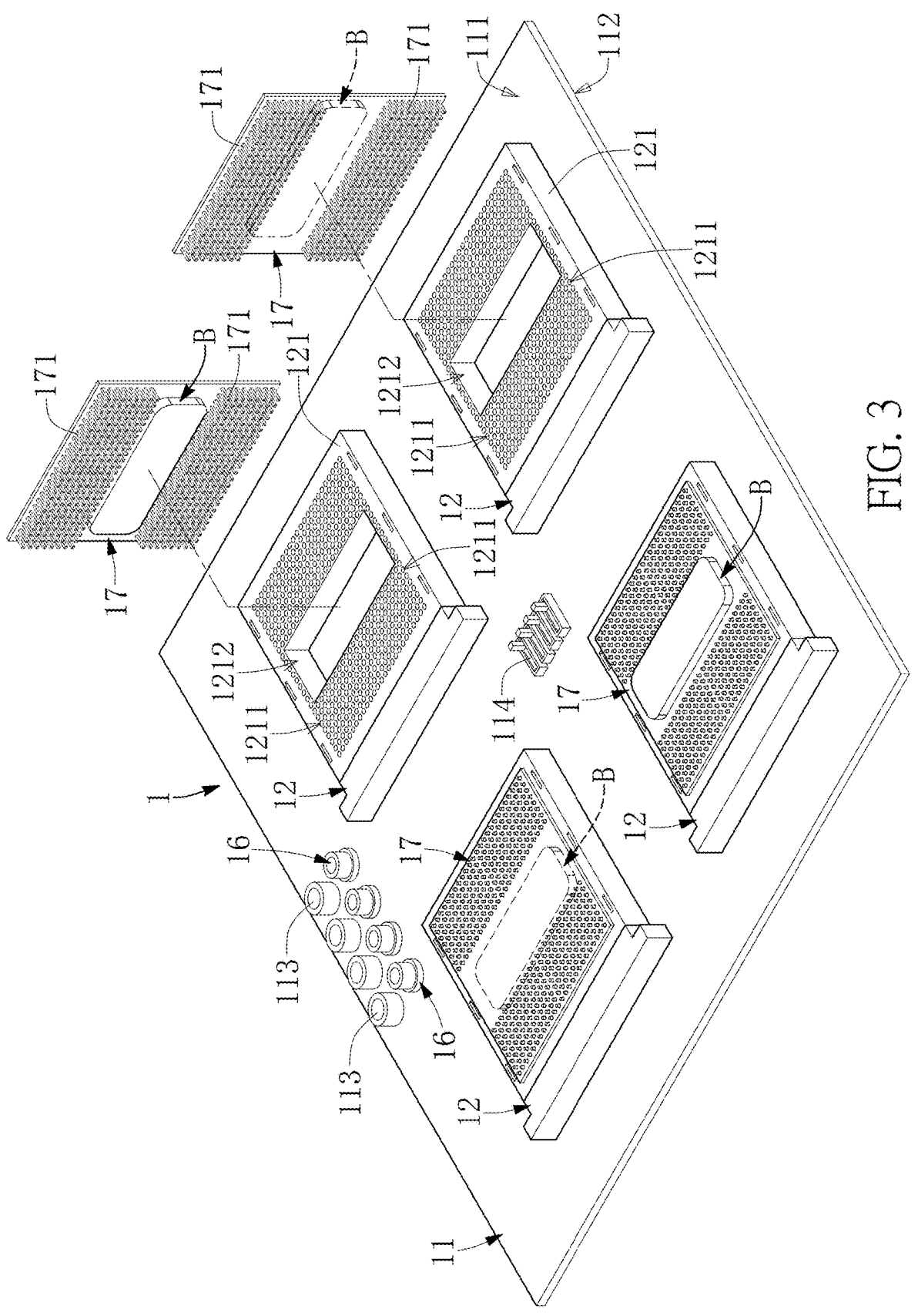
FIG. 3 is a schematic exploded view of a circuit mainboard and the chip carrier board of the testing device according to the present disclosure.
Figure 4:
FIG. 4 is a schematic view of the testing device being connected to an external power supply, an external signal reading device, and an external signal input device according to the present disclosure.
Figure 5:
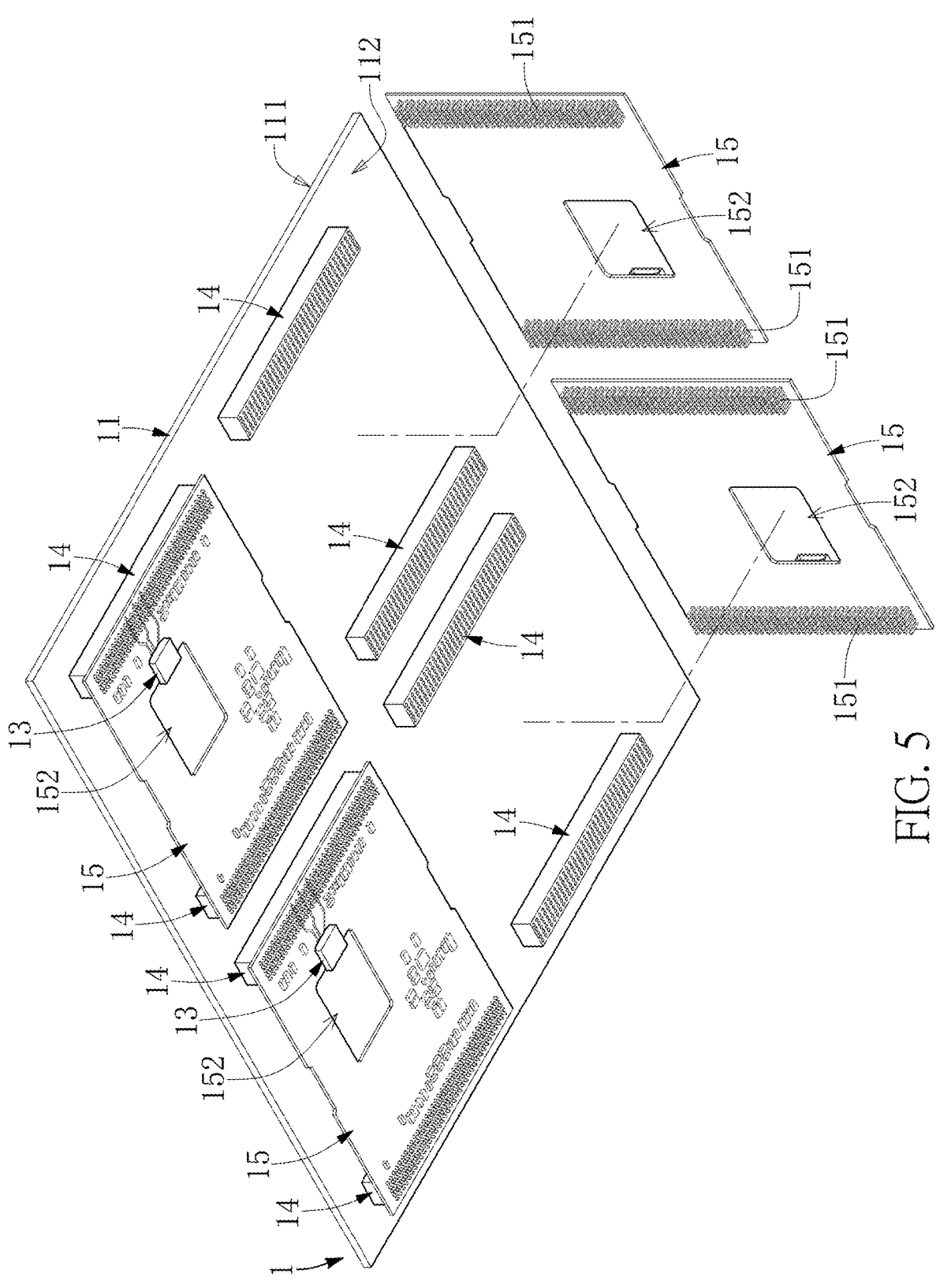
FIG. 5 is a schematic exploded view of the circuit mainboard and a signal carrier board of the testing device according to the present disclosure.

Referring to FIG. 1 to FIG. 5, FIG. 1 and FIG. 2 are schematic views from different viewing angles of a testing device having a chip carrier board according to the present disclosure, FIG. 3 is a schematic exploded view of a circuit mainboard and the chip carrier board of the testing device according to the present disclosure, FIG. 4 is a schematic view of the testing device being connected to an external power supply, an external signal reading device, and an external signal input device according to the present disclosure, and FIG. 5 is a schematic exploded view of the circuit mainboard and a signal carrier board of the testing device according to the present disclosure.

A testing device 1 of the present disclosure is provided to allow testing personnel to conveniently and quickly perform testing for a chip under test B, and is particularly suitable for use in scenarios where the chip under test B undergoes MIPI tests.

The testing device 1 of the present disclosure includes a circuit mainboard 11, a plurality of chip sockets 12, at least one signal input connector 13, a plurality of carrier board connectors 14, a plurality of signal carrier boards 15, and a plurality of signal output connectors 16. Quantities of the chip sockets 12, the signal input connector 13, the carrier board connectors 14, the signal carrier boards 15, and the signal output connectors 16 included in the testing device 1 can be selected according to practical requirements and are not limited to the quantity as shown in the figure. The testing device 1 includes the same quantity of the chip sockets 12, the signal input connectors 13, and the signal carrier boards 15.

Two opposite sides of the circuit mainboard 11 are respectively defined as a first side 111 and a second side 112. A plurality of power connectors 113 and a plurality of chip sockets 12 are provided on the first side 111 of the circuit mainboard 11. The quantity of the power connectors 113 provided on the circuit mainboard 11 is essentially the same as the quantity of the chip sockets 12 provided on the circuit mainboard 11, but is not limited thereto.

Each of the chip sockets 12 is used to carry a chip carrier board 17. A chip under test B is fixedly disposed on one side of the chip carrier board 17. Each of the power connectors 113 is connected to an external power supply C, and the plurality of power connectors 113 are used to allow the power provided by the external power supply C to be transmitted through the circuit mainboard 11 to the plurality of chip carrier boards 17 disposed on the plurality of chip sockets 12, thereby enabling the chip under test B on each of the chip carrier boards 17 to obtain the power required for operation.

In one embodiment, each of the power connectors 113 may be electrically independent from each other, and each of the power connectors 113 is used to allow the external power supply C to provide power to the signal carrier board 15 on one of the chip sockets 12. Therefore, the chip under test B on the signal carrier board 15 obtains power. In one embodiment where each of the power connectors 113 is independent from each other, different power connectors 113 can allow the power from external power supplies C having different voltages to be transmitted to the chip carrier boards 17 on different chip sockets 12 through the circuit mainboard 11, such that the chip under test B on different chip carrier boards 17 can obtain power of different voltages.

In one embodiment, a single power connector 113 can also be used to allow the external power supply C to provide power to the signal carrier boards 15 on two or more chip sockets 12, such that the chips under test B disposed on the signal carrier boards 15 obtain power. In one embodiment, two or more power connectors 113 can also be used together to allow the external power supply C to provide power to the signal carrier board 15 on a single chip socket 12, such that the chip under test B on the signal carrier board 15 obtains power.

In one alternative embodiment, a plurality of power switching modules 114 can be disposed on the circuit mainboard 11. Each of the power switching modules 114 is disposed between at least one of the power connectors 113 and at least one of the chip sockets 12, and each of the power switching modules 114 can be operated by a user, such that the power switching module 114 can be switched between at least two states. For example, the power switching module 114 can be operated by the user to be switched between two states of switched- on and switched-off. Specifically, each of the power switching modules 114 is, for example, a switch jumper.

A plurality of signal output connectors 16 can be disposed on the first side 111 of the circuit mainboard 11, and each of the signal output connectors 16 is connected to an external signal reading device D. A specific style and location of each of the signal output connectors 16 can be designed based on the implementation of the external signal reading device D. For example, when the chip under test B is an MIPI Driver IC, the external signal reading device D can be an oscilloscope.

After the chip under test B on the chip carrier board 17 disposed on the chip socket 12 is powered, an output signal that is output by the chip under test B can be transmitted to the external signal reading device D through the circuit mainboard 11 and one of the signal output connectors 16.

In practice, relevant testing personnel may first fix the chip under test B onto the chip carrier board 17 by a manner such as welding. The form of the chip carrier board 17 can be designed according to practical requirements. For example, a plurality of pins 171 of the chip carrier board 17 and the chip under test B can be located on a same side of the chip carrier board 17, or the plurality of pins 171 and the chip under test B are arranged on different sides of the chip carrier board 17.

As shown in FIG. 3, in practical applications, each of the chip sockets 12 may include a main body 121. The main body 121 includes a plurality of pin perforations 1211 and an accommodating groove 1212. Each of the pin perforations 1211 penetrates the main body 121. The accommodating groove 1212 may be, for example, a groove formed by the main body 121 recessed inward, or the accommodating groove 1212 may also be a perforation that penetrates the main body 121. When the chip carrier board 17 is disposed on the chip socket 12, the plurality of pins 171 of the chip carrier board 17 correspondingly plug into the plurality of pin perforations 1211, and the plurality of pins 171 are used to be electrically connected with the circuit mainboard 11. In practical applications, relevant conductive structures may be provided in each of the pin perforations 1211 of the chip socket 12, and the conductive structures are connected to the circuit mainboard 11. After each of the pins 171 plug into the corresponding pin perforation 1211, each of the pins 171 can be electrically connected to the circuit mainboard 11 through a corresponding conductive structure.

If the chip under test B and the plurality of pins 171 of the chip carrier board 17 are located on the same side, then, when the chip carrier board 17 is disposed on the chip socket 12, the chip under test B will be accommodated in the accommodating groove 1212. Through the design of the accommodating groove 1212, the chip carrier board 17 can be mounted on the chip socket 12 regardless of whether the plurality of pins 171 of the chip carrier board 17 and the chip under test B are located on the same side or on different sides.

It should be noted that, in practice, the personnel for testing may only receive the chip under test B, and the personnel for testing needs to manually fix the chip under test B on the chip carrier board 17. In this case, the personnel for testing will be able to fix the chip under test B on the side of the chip carrier board 17 having the pins 171 or not having the pins 171. However, in different embodiments, the personnel for testing may also directly receive the chip carrier board 17 having the chip under test B mounted thereon.

In the case where the personnel for testing directly receives the chip carrier board 17 having the chip under test B mounted thereon, the personnel for testing will not be able to modify the position of the chip under test B. Therefore, if the pins 171 of the chip carrier board 17 and the chip under test B are fixed on the same side, the chip socket 12 needs to have an accommodating groove 1212 to allow the chip carrier board 17 to be successfully mounted on the chip socket 12.

Since the chip under test B is fixed on the chip carrier board 17 and the chip carrier board 17 is detachably disposed on the chip socket 12, when a different chip under test B needs to be tested, the testing personnel only needs to fix the chip under test B on a different one of the chip carrier boards 17, and the testing personnel does not need to modify the circuit mainboard 11 and the related electronic components provided on the circuit mainboard 11. In other words, since the chip under test B is not fixed on the circuit mainboard 11, unless relevant traces on the circuit mainboard 11 are damaged, the testing personnel does not need to replace or modify the circuit mainboard 11 when a different chip under test B is tested.

In addition, since the chip under test B is fixedly disposed on the chip carrier board 17, during the testing of the chip under test B, if the test results apparently exceed an expected range, the testing personnel can quickly detect the chip carrier board 17 and the circuit mainboard 11 to quickly find the issue that causes the erroneous test result. For example, the testing personnel can directly mount the chip carrier board 17 on the chip socket 12 of another circuit mainboard 11 and perform a re-testing. If the re-testing is successful, the test result may indicate that the original circuit mainboard 11 is damaged; alternatively, the testing personnel can directly mount the chip carrier board 17 on another chip socket 12 of the original circuit mainboard 11. If the test result is normal, the test result may indicate that the original chip socket 12 is damaged. In practice, when the testing personnel performs the above-mentioned processes, since the chip carrier board 17 is detachably mounted on the chip socket 12, the testing personnel can quickly move the chip carrier board 17 to another chip socket 12 of the same circuit mainboard 11, or a chip socket 12 on another circuit mainboard 11, and the testing personnel does not need to remove the chip under test B that is soldered to the chip carrier board 17.

Figure 6:
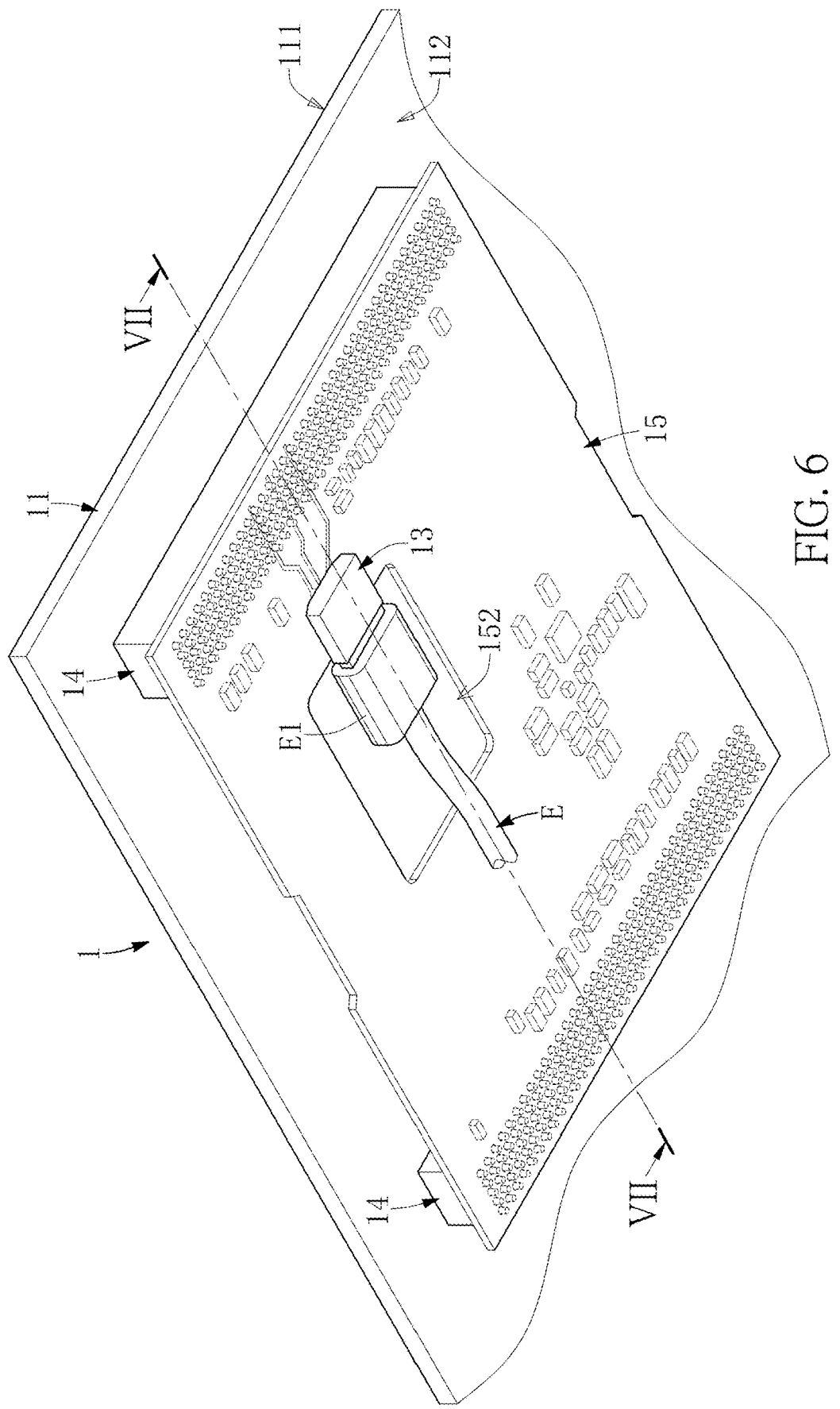
FIG. 6 is a schematic view of the signal carrier board mounted on the circuit mainboard of the testing device according to the present disclosure.
Figure 7:
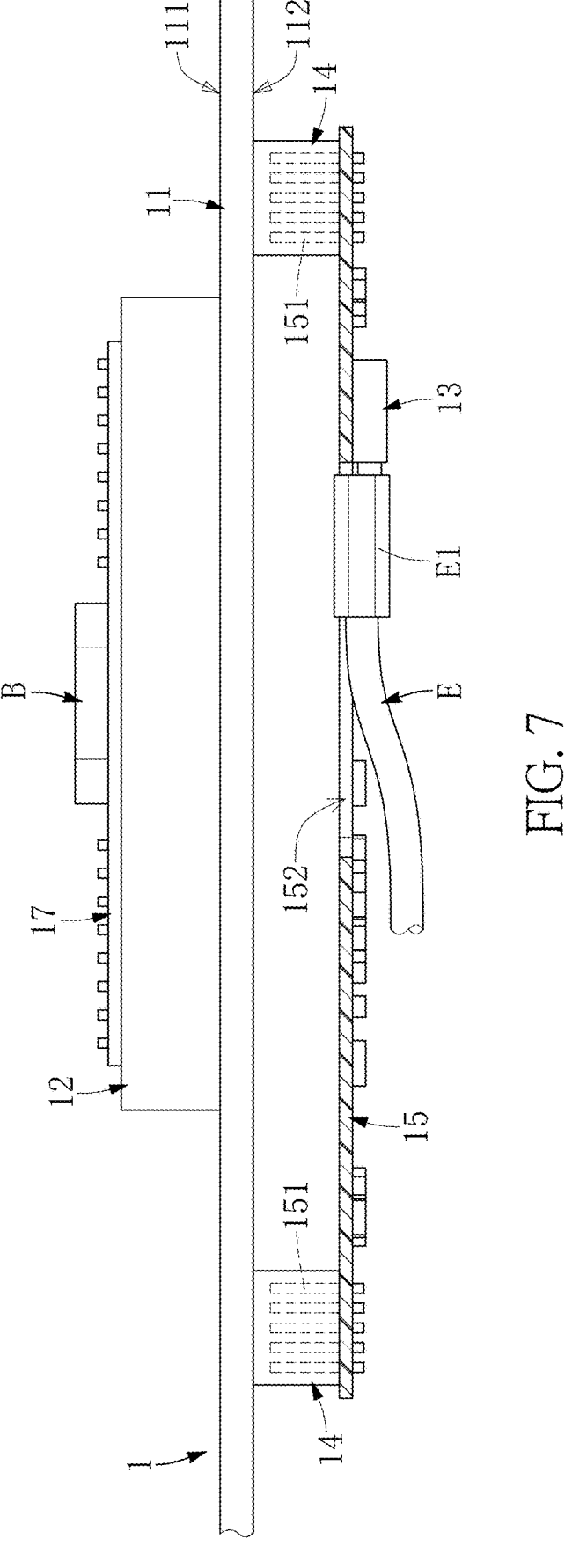
FIG. 7 is a schematic cross-sectional view taken along line VII-VII of FIG. 6.
Figure 8:
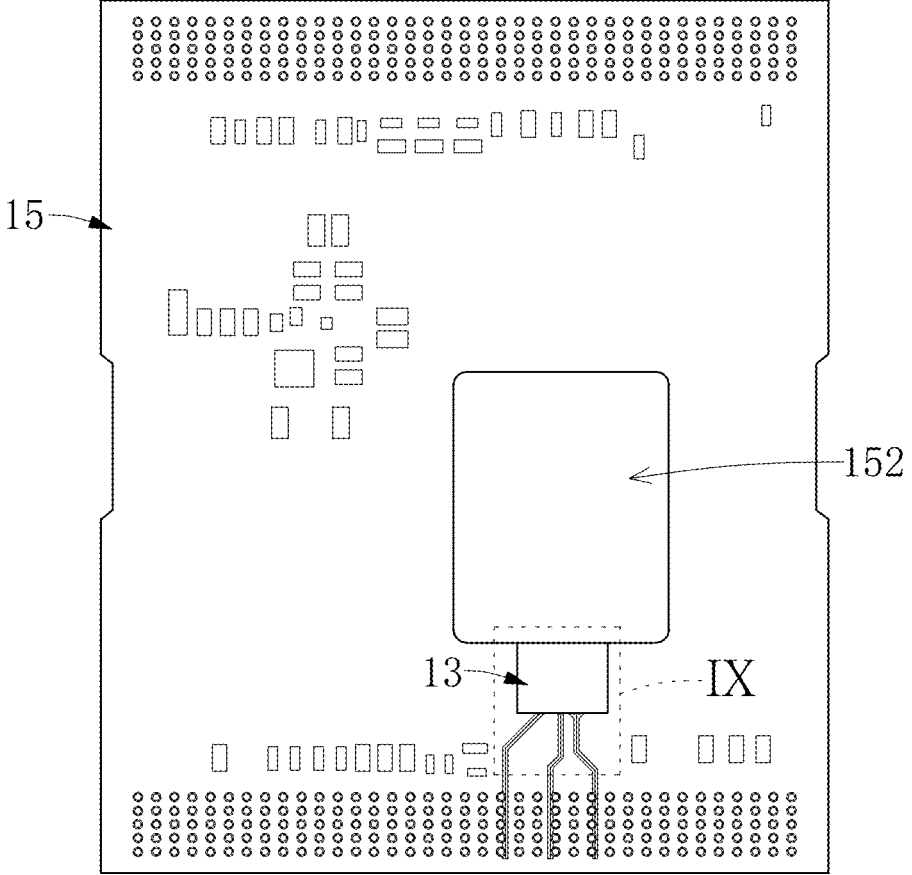
FIG. 8 is a schematic top view of the signal carrier board.
Figure 9:
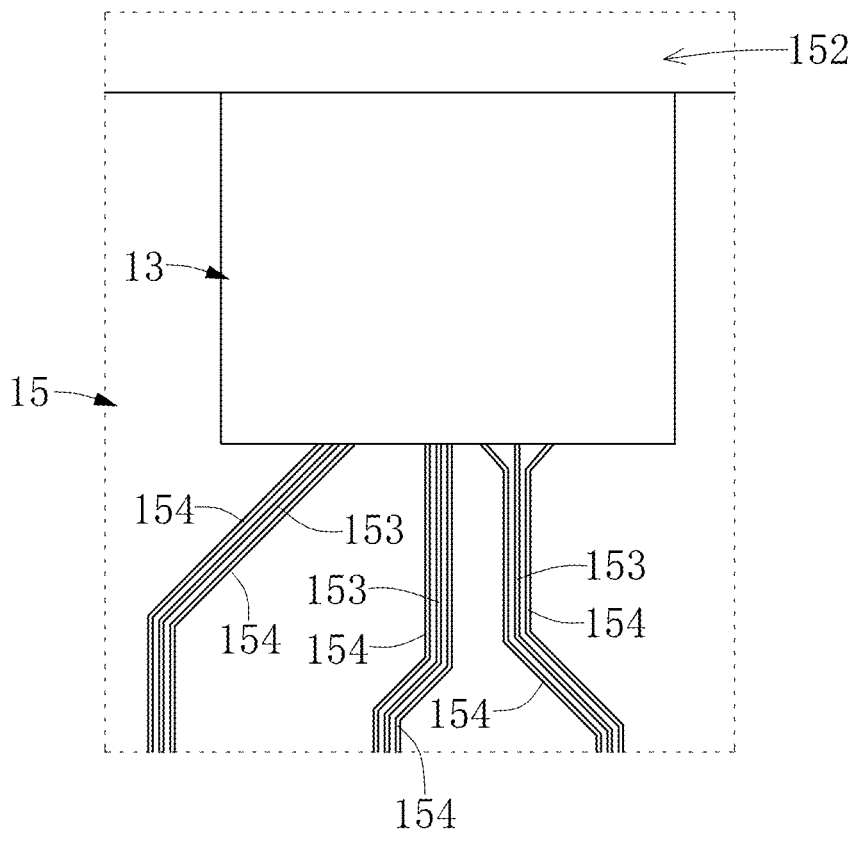
FIG. 9 is a schematic partially enlarged view of FIG. 8.
Figure 10:
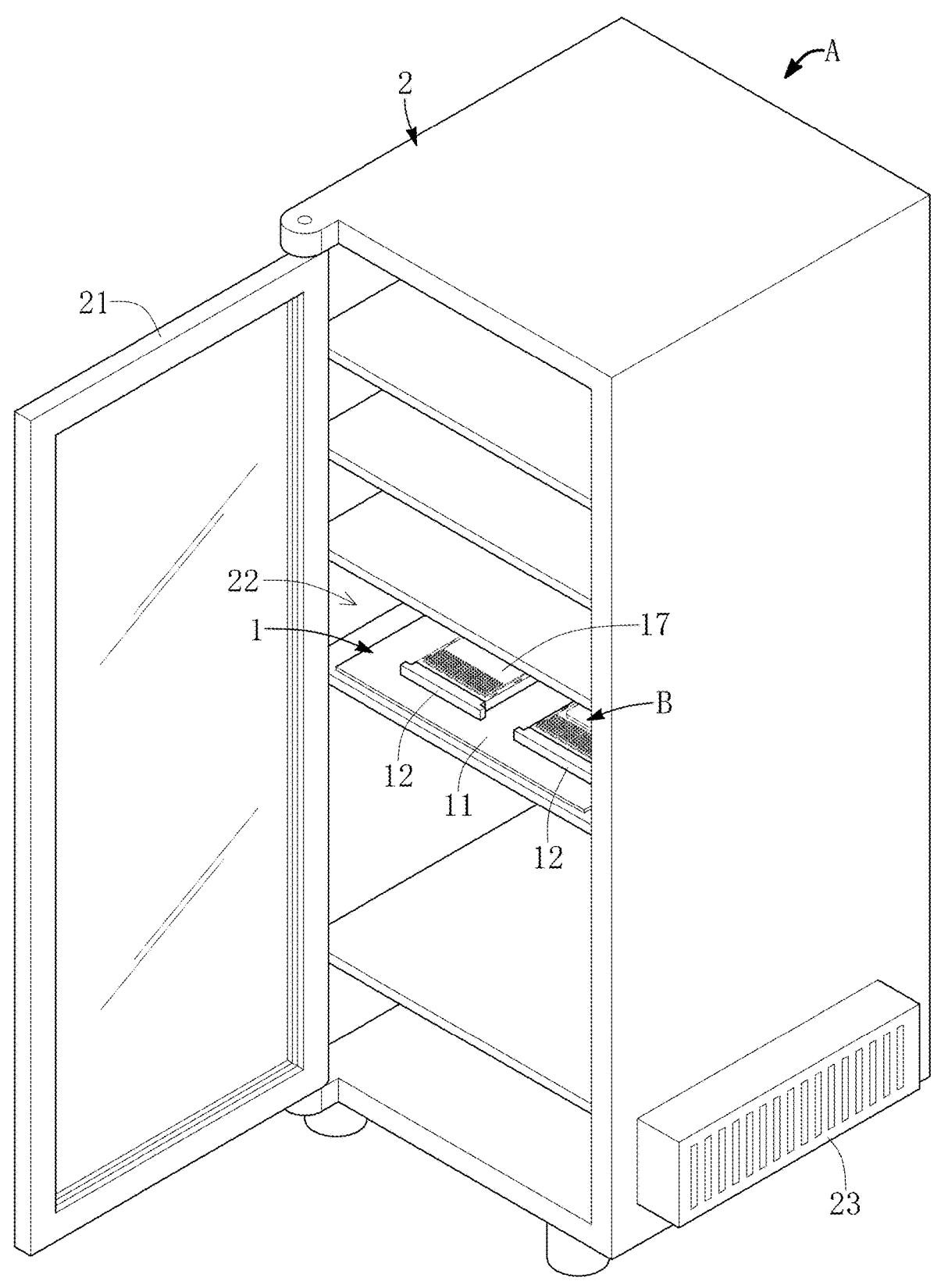
FIG. 10 is a schematic view of the testing system according to the present disclosure.

Referring to FIG. 5 to FIG. 9, FIG. 5 is a schematic exploded view of the circuit mainboard and a signal carrier board of the testing device according to the present disclosure, FIG. 6 is a schematic view of the signal carrier board mounted on the circuit mainboard of the testing device according to the present disclosure, FIG. 7 is a schematic cross-sectional view taken along line VII-VII of FIG. 6, FIG. 8 is a schematic top view of the signal carrier board, and FIG. 9 is a schematic partially enlarged view of FIG. 8.

The plurality of carrier board connectors 14 are disposed on the second side 112 of the circuit mainboard 11. Two adjacent ones of the carrier board connectors 14 can be used to interconnect with a plurality of plug connectors 151 of one of the signal carrier boards 15, and each of the signal carrier boards 15 can be detachably fixed on the second side 112 of the circuit mainboard 11 through the carrier board connectors 14. The quantity and location of the plug connectors 151 of the signal carrier boards 15 can be changed according to requirements. In the figures of this embodiment, each of the plug connectors 151 includes multiple pins, but the design of each of the plug connectors 151 is not limited thereto.

The signal carrier boards 15 can be electrically connected to the chip under test B on the chip socket 12 of the first side 111 through the plug connectors 151, the carrier board connectors 14, and the circuit mainboard 11. Each of the signal carrier boards 15 has the signal input connectors 13 disposed thereon. A connector E1 at one end of a signal input line E plugs into the at least one of the plurality of signal input connectors 13. For example, the signal input connectors 13 can be audio and video transmission connectors such as HDMI connectors, or various signal transmission connectors such as high-frequency signal transmitters, but are not limited thereto.

As shown in FIG. 6 and FIG. 7, each of the signal carrier boards 15 may further have a clearance hole 152, and the clearance hole 152 penetrates the signal carrier board 15. The clearance hole 152 is used to accommodate the connector E1 of the signal input line E. Through the design of the clearance hole 152, when the connector E1 of the signal input line E plugs into the signal input connector 13, the connector E1 of the signal input line E can be accommodated in the clearance hole 152, and the connector E1 does not interfere with the signal carrier board 15. Another end of the signal input line E is connected to an external signal input device F.

Since the signal carrier board 15 is detachably connected to the circuit mainboard 11, the testing personnel can perform different tests on the chip under test B by replacing different signal carrier boards 15 according to practical requirements. Furthermore, the testing personnel can also modify the traces and other designs of the signal carrier board 15 according to the test requirements, such that the signal carrier board 15 can meet the specific test requirements. For example, if the testing personnel conducts an MIPI test experiment on the chip under test B when the signal input connector 13 is an HDMI connector and the chip under test B is a MIPI Driver IC, the testing personnel can test the traces on the signal carrier board 15. Specifically, the traces that are used to connect to an HDMI connector are specially designed, such that the signal carrier board 15 can meet the high-frequency impedance matching requirements.

In this way, the chip under test B can undergo RA/HTOL test under a video mode. Naturally, the relevant traces of the chip socket 12 and the circuit mainboard 11 can also be designed to perform high-frequency impedance matching.

As shown in FIG. 8 and FIG. 9, for example, in the case where the signal input connector 13 of the signal carrier board 15 is an HDMI connector, a grounding trace 154 can be disposed on two sides of each of a plurality of signal traces 153 for connecting to the at least one signal input connector 13 on each of the plurality of signal carrier boards 15, and each of the plurality of signal traces 153 can be located between two of the grounding traces 154. Such a design can effectively allow the signal carrier board 15 to comply with the high-frequency impedance matching requirements, such that high-frequency signals transmitted through the signal traces 153 are less susceptible to interference from external signals.

In other words, by allowing the signal carrier boards 15 to be detachably mounted on the second side 112 of the circuit mainboard 11, the testing personnel can modify or replace the signal carrier boards 15 to ensure that the signal input by the external signal input device F passes through the signal carrier board 15 can be input to the chip under test B in a high-frequency transmission state that meets the requirements.

The existing relevant testing devices or testing systems lack the design in which the above-mentioned signal carrier board 15 can be detachably connected to the circuit mainboard 11. Therefore, when the testing personnel conducts high-frequency signal testing on the chip under test B, since signal loss often occurs during the transmission process, the high-frequency signal transmission cannot be performed correctly, or the testing personnel can only input low-frequency signals and cannot test the high-frequency signal used in the practical applications of the chip under test B.

Accordingly, in the testing device 1 of the present disclosure, by the design such as the chip carrier board 17 being detachably fixed to the first side 111 of the chip socket 12, the signal carrier board 15 being detachably fixed to the second side 112 of the circuit mainboard 11, and the signal input connector 13 being fixedly disposed on the signal carrier board 15, the testing personnel can easily modify one of the chip carrier board 17 and the signal carrier board 15 according to the test required for the chip under test B, thereby allowing the chip under test B to be tested under conditions that meet the requirements. For example, when MIPI testing of high-frequency signals needs to be performed on the chip B under test, since the traces of the circuit mainboard 11 meets the requirements for high-frequency transmission, the testing personnel only needs to ensure that the traces on the chip carrier board 17 and the signal carrier board 15 meet the requirements for high-frequency transmission to allow the chip under test B to be tested under conditions of the high-frequency signal tests.

Furthermore, it should be noted that, by the design of the power connectors 113 and the signal input connector 13 being located on opposite sides of the circuit mainboard 11, the interferences to the signal input by the signal input connector 13 can be effectively reduced.

Moreover, by the design of the signal carrier boards 15 being detachably connected to the circuit mainboard 11, the user can simply replace different signal carrier boards 15. Therefore, the signals can be input to the chip under test B through different signal input connectors 13 provided on the signal carrier boards 15. The relevant personnel does not need to redesign the circuit mainboard 11 or the chip carrier board 17. In this way, the overall cost-effectiveness of the testing device 1 can be higher, and the application flexibility is greater.

Referring to FIG. 1, FIG. 2, FIG. 4 and FIG. 10, FIG. 10 is a schematic view of the testing system according to the present disclosure. A testing system A of the present disclosure includes: a temperature control apparatus 2 and at least one of the testing device 1 of the present disclosure. Details regarding to the testing device 1 can be referred to in the foregoing description, and will not be reiterated herein.

The temperature control apparatus 2 includes a movable door 21, at least one chamber 22, and at least one temperature control device 23. A number of the at least one chamber 22 included in the temperature control apparatus 2 can be changed according to requirements. The at least one temperature control device 23 is mainly used to control the temperature of the at least one chamber 22 so as to maintain the temperature of the at least one chamber 22 to be at a preset low temperature or a preset high temperature. The movable door 21 can be operated to close the at least one chamber 22, and the at least one temperature control device 23 is used to maintain the temperature in the at least one chamber 22 to be at a preset temperature.

In practical applications, if the testing personnel wants to test the chip under test B at a specific temperature, the testing personnel can place the testing device 1 into the chamber 22, pull a connection wire connected to the testing device 1 out from the temperature control apparatus 2, and connect the connection wire to the external power supply C, the external signal reading device D, (such as an oscilloscope) and the external signal input device F located outside the chamber 22. How the relevant connection wire is passed out from the chamber 22 for being connected to the external power supply C, the external signal reading device D, and the external signal input device F is not limited herein.

Naturally, in different variations, the temperature control apparatus 2 can also be integrated into a single device with the external power supply C, the external signal reading device D, and the external signal input device F that need to be connected to the testing device 1, and the chamber 22 may include relevant connection wires. After the testing personnel places the testing device 1 into the chamber 22, the connection wires located in the chamber 22 need to be connected to the testing device 1.

In conclusion, the testing system A of the present disclosure can be used to allow the testing personnel to conveniently test the chip under test B, and is especially suitable for use in the scenario of performing MIPI/RA/HTOL tests on the chip under test B.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A testing device, comprising:
   a circuit mainboard, wherein two opposite sides of the circuit mainboard are respectively defined as a first side and a second side, and a plurality of power connectors are disposed on the first side of the circuit mainboard;
   a plurality of chip sockets disposed on the first side, wherein each of the chip sockets is used to carry a chip carrier board, and a chip under test is fixedly disposed on one side of the chip carrier board;
   a plurality of signal output connectors disposed on the circuit mainboard, wherein each of the plurality of signal output connectors is used to connect with an external signal reading device;
   a plurality of carrier board connectors disposed on the second side of the circuit mainboard;
   a plurality of signal carrier boards, wherein each of the plurality of signal carrier board is detachably disposed on the second side of the circuit mainboard through the plurality of carrier board connectors, and each of the plurality of signal carrier boards is able to be electrically connected to the chip under test disposed on the chip socket on the first side through the carrier board connector and the circuit mainboard; and
   a plurality of signal input connectors, wherein each of the plurality of signal carrier boards includes at least one of the plurality of signal input connectors, and a connector at one end of a signal input line plugs into the at least one of the plurality of signal input connectors;
   wherein the chip under test obtains power provided by an external power supply from a corresponding one of the plurality of power connectors through a corresponding one of the plurality of chip carrier boards and the circuit mainboard; wherein the chip under test obtains a test signal transmitted via the signal input line through the chip carrier board, the circuit mainboard, a corresponding one of the signal carrier boards, and a corresponding one of the signal input connectors; wherein the chip under test transmits signals to the external signal reading device through the corresponding chip carrier board, the circuit mainboard, and a corresponding one of the signal output connectors.

2. The testing device according to claim 1, wherein each of the chip sockets includes a main body, the main body includes a plurality of pin perforations and an accommodating groove, and each of the plurality of pin perforations penetrates the main body; wherein one side of the chip carrier board has a plurality of pins, and the chip under test and the plurality of pins are arranged on a same side or different sides of the chip carrier board; wherein, when the chip carrier board is disposed on the chip socket, the plurality of pins correspondingly penetrate through the plurality of pin perforations; wherein the accommodating groove is used to accommodate the chip under test on the chip carrier board disposed on the chip socket.

3. The testing device according to claim 2, wherein a grounding trace is disposed on two sides of each of a plurality of signal traces for connecting to the at least one signal input connector on each of the plurality of signal carrier boards, and each of the plurality of signal traces is located between two of the grounding traces.

4. The testing device according to claim 1, wherein a plurality of power switching modules are disposed on the circuit mainboard, and each of the plurality of power switching modules is disposed between circuitries of at least one of the power connectors and at least one of the chip sockets.

5. The testing device according to claim 1, wherein each of the signal carrier boards has a clearance hole that penetrates the signal carrier board; wherein, when the connector at one end of the signal input line plugs into the at least one of the plurality of signal input connectors, the clearance hole is used to accommodate the connector of the signal input line.

6. A testing system, comprising:

a testing device including:

a circuit mainboard, wherein two opposite sides of the circuit mainboard are respectively defined as a first side and a second side, and a plurality of power connectors are disposed on the first side of the circuit mainboard;

a plurality of chip sockets disposed on the first side, each of the chip sockets is used to carry a chip carrier board, and a chip under test is fixedly disposed on one side of the chip carrier board;

a plurality of signal output connectors disposed on the circuit mainboard, wherein each of the plurality of signal output connectors is used to connect with an external signal reading device;

a plurality of carrier board connectors disposed on the second side of the circuit mainboard;

a plurality of signal carrier boards, wherein each of the plurality of signal carrier board is detachably disposed on the second side of the circuit mainboard through the plurality of carrier board connectors, and each of the plurality of signal carrier boards is able to be electrically connected to the chip under test disposed on the chip socket on the first side through the carrier board connector and the circuit mainboard; and a plurality of signal input connectors, wherein each of the plurality of signal carrier boards includes at least one of the plurality of signal input connectors, and a connector at one end of a signal input line plugs into the at least one of the plurality of signal input connectors;

wherein the chip under test obtains power provided by an external power supply from a corresponding one of the plurality of power connectors through a corresponding one of the plurality of chip carrier boards and the circuit mainboard; wherein the chip under test obtains a test signal transmitted via the signal input line through the chip carrier board, the circuit mainboard, a corresponding one of the signal carrier boards, and a corresponding one of the signal input connectors; wherein the chip under test transmits signals to the external signal reading device through the corresponding chip carrier board, the circuit mainboard, and a corresponding one of the signal output connectors; and a temperature control apparatus including a movable door, at least one chamber, and at least one temperature control device, wherein the movable door is able to be operated to close the at least one chamber, the temperature control device is used to maintain a temperature in the at least one chamber to be at a preset temperature; wherein the at least one chamber is able to accommodate at least one of the testing device, so that the testing device performs testing at the preset temperature.

7. The testing system according to claim 6, wherein each of the chip sockets includes a main body, the main body includes a plurality of pin perforations and an accommodating groove, and each of the plurality of pin perforations penetrates the main body; wherein one side of the chip carrier board has a plurality of pins, and the chip under test and the plurality of pins are arranged on a same side or different sides of the chip carrier board; wherein, when the chip carrier board is arranged on the chip socket, the plurality of pins correspondingly penetrate through the plurality of pin perforations; wherein the accommodating groove is used to accommodate the chip under test on the chip carrier board disposed on the chip socket.

8. The testing system according to claim 7, wherein a grounding trace is disposed on two sides of each of a plurality of signal traces for connecting to the at least one signal input connector on each of the plurality of signal carrier boards, and each of the plurality of signal traces is located between two of the grounding traces.

9. The testing system according to claim 6, wherein a plurality of power switching modules are disposed on the circuit mainboard, and each of the plurality of power switching modules is disposed between circuitries of at least one of the power connectors and at least one of the chip sockets.

10. The testing system according to claim 6, wherein each of the signal carrier boards has a clearance hole that penetrates the signal carrier board; wherein, when the connector at one end of the signal input line plugs into the at least one of the plurality of signal input connectors, the clearance hole is used to accommodate the connector of the signal input line.

*    *    *    *    *